United States Patent [19]
Johnson

[11] Patent Number: 5,861,654
[45] Date of Patent: Jan. 19, 1999

[54] IMAGE SENSOR ASSEMBLY

[75] Inventor: Dean A. Johnson, Churchville, N.Y.

[73] Assignee: Eastman Kodak Company, Rochester, N.Y.

[21] Appl. No.: 563,832

[22] Filed: Nov. 28, 1995

[51] Int. Cl.[6] ...................... H01L 31/0203; H01L 23/544
[52] U.S. Cl. .......................... 257/433; 257/797; 361/802; 361/820; 356/399; 250/208.1
[58] Field of Search ................... 257/432, 433, 257/434, 797; 250/208.1, 208.2; 356/399; 361/802, 820

[56] References Cited

U.S. PATENT DOCUMENTS

| | | | |
|---|---|---|---|
| 4,893,163 | 1/1990 | Rudeck | 357/40 |
| 4,940,888 | 7/1990 | Nagata et al. | 250/208.1 |
| 5,011,256 | 4/1991 | Johnson et al. | 257/433 |
| 5,065,226 | 11/1991 | Kluitmans et al. | 257/433 |
| 5,122,861 | 6/1992 | Tamura et al. | 257/434 |
| 5,130,531 | 7/1992 | Ito et al. | 257/432 |
| 5,132,532 | 7/1992 | Watanabe | 257/433 |
| 5,408,131 | 4/1995 | Khatri et al. | 257/797 |
| 5,525,840 | 6/1996 | Tominaya | 257/797 |
| 5,536,974 | 7/1996 | Nishiguchi | 257/778 |

FOREIGN PATENT DOCUMENTS

| | | | |
|---|---|---|---|
| 62-183145 | 8/1987 | Japan | H01L 23/00 |
| 3-155648 | 6/1988 | Japan | H01L 23/02 |
| 1-217950 | 8/1989 | Japan | H01L 12/02 |
| 2-112280 | 4/1990 | Japan | H01L 27/14 |

OTHER PUBLICATIONS

"Exact constraint design" by Jon M. Kriegel. May 1995 issue of *Mechanical Engineering*, pp. 88–90.

*Primary Examiner*—David Ostrowski
*Attorney, Agent, or Firm*—David M. Woods

[57] ABSTRACT

An image sensor assembly is mounted in an optical system having a plurality of reference locators. The image sensor assembly includes an image sensing device having photolithographically generated elements, such as image sensing sites, and a carrier package for enclosing the image sensing device. The carrier package has externally accessible reference features that are optically aligned with respect to the photolithographically generated elements on the image sensing device. Moreover, the externally accessible reference features are used to exactly constrain the image sensor assembly relative to the reference locators. Referencing the image sensing device to the same features that are used for exact constraint removes the effect of material variations that may cause dimensional changes and eliminates the need to activate the sensor for alignment of the sensor assembly in the optical system.

11 Claims, 5 Drawing Sheets

IMAGE SENSOR ASSEMBLY

FIELD OF THE INVENTION

The invention relates generally to the field of image sensing devices and packaging therefor, and in particular to a carrier package for containing an image sensing device. More specifically, the invention relates to an image sensor assembly including an image sensing device emplaced in a carrier package.

BACKGROUND OF THE INVENTION

In a typical imaging application, a solid state image sensing device, in the form of an integrated circuit die (chip), is attached to a cavity in a chip carrier package. The position of the image sensing device is located approximately within an alignment pattern (typically, a cross hair pattern) that is etched in the bottom of the cavity of the chip carrier package. In a typical assembly operation, a video camera is used to find a cut edge of the die as well as the chip carrier alignment pattern. The image sensing device is then centered relative to the alignment pattern and potted in place in the carrier package with glue. The package is usually a laminated ceramic (cerdip), a metal lead frame with ceramic or plastic attached on the top and bottom of the lead frame (plastic dip), or a plastic dual-in-line package. The image sensing device is finally sealed in the chip carrier cavity with a cover glass to protect the image sensing device from contamination.

This entire image sensor (die/carrier) assembly is approximately located in the optical system that is to use it and the image sensing device is then energized. The optical system images one or more imaging targets upon the image sensor assembly, which produces corresponding image signals that are used to precisely position the image sensor assembly in the optimum focus position for the optical system. It is customary for this positioning process to exactly locate the image sensor assembly within the optical system relative to the usual six degrees of positional freedom. This active alignment technique, however, requires extensive fixturing and a significant time to complete. The carrier package may have significant variation, up to ±10%, due to the process used to fabricate the carrier packages. In particular, there may be significant variation between the cut edges used in alignment and the optically active pixel sites in the image sensing device. Moreover, the image sensor assembly process restricts subsequent alignment inspection due to the alignment marks being obscured under the glue used to bond the image sensing device to the carrier package. Inspection with a video camera after assembly for device placement accuracy is therefore difficult or impossible.

Japanese patent publication 2112280 (1990) suggests use of exact constraints to mechanically locate the cut edges of the image sensing device to features machined in a metal plate that composes the base of the carrier package. An additional locating feature is cut into the edge of the machined metal plate for use as a positioning reference with respect to the optical system in the final product. The patent publication discloses use of the cut edges to locate the image sensing device; however, the aforementioned problem remains, that is, the possibility of significant variation between the cut edges used in alignment and the optically active pixel sites in the image sensing device. Moreover, the locating feature cut into the edge of the machined metal plate neither increases the existing precision nor does it inherently provide exact constraint of the carrier package in the final product.

To simplify production assembly and to allow for image sensor (die/carrier) assembly replacement in the field, it would be desirable to use a passive alignment technique, not requiring video imaging, in which external reference features/datums on the sensor package are used throughout the process, that is, in the sensor assembly process as well as in the final product assembly process. Ideally, the chip carrier package design would specify a standard set of reference features/datums for fabricating and assembling the sensor package, and for positioning the package in the final product.

SUMMARY OF THE INVENTION

The present invention is directed to method and apparatus for overcoming one or more of the problems set forth above. Briefly summarized, according to one aspect of the present invention, an image sensor assembly for mounting in an optical system comprises an image sensing device having photolithographically generated elements and a carrier package for enclosing the image sensing device, wherein the carrier package has externally accessible reference features that are aligned with respect to at least one of the photolithographically generated elements on the image sensing device.

In another aspect of the invention, the image sensor assembly is mounted in an optical system having a plurality of reference locators. The image sensor assembly comprises an image sensing device and a carrier package adapted for exact constraint to a set of features on the carrier package that are externally accessible to the reference locators, wherein the carrier package supports the image sensing device in a location within the carrier package that is referenced to the set of features.

An advantageous feature of the invention is the common reference feature that is used for positioning both the image sensing device (die) on the carrier package and the sensor assembly (die plus carrier package) in the optical system using the device. Referencing the image sensing device to the same features that are used for exact constraint removes the effect of material variations that may cause dimensional changes. Alignment based on these reference features and not on the cut edge of the die eliminates the placement variation due to the wafer cutting process. The use of a common reference feature also eliminates positional variation due to the ceramic package variation and reduces the number of possible interfaces that contribute to the "stacking up" of tolerances in the assembly process. In addition, it is unnecessary to use a vision system like a video camera in mounting the sensor assembly in the optical system, which simplifies the problem of field servicing and replacement of sensor assemblies in such optical systems.

These and other aspects, objects, features and advantages of the present invention will be more clearly understood and appreciated from a review of the following detailed description of the preferred embodiments and appended claims, and by reference to the accompanying drawings.

DETAILED DESCRIPTION OF THE INVENTION

Figure 1:
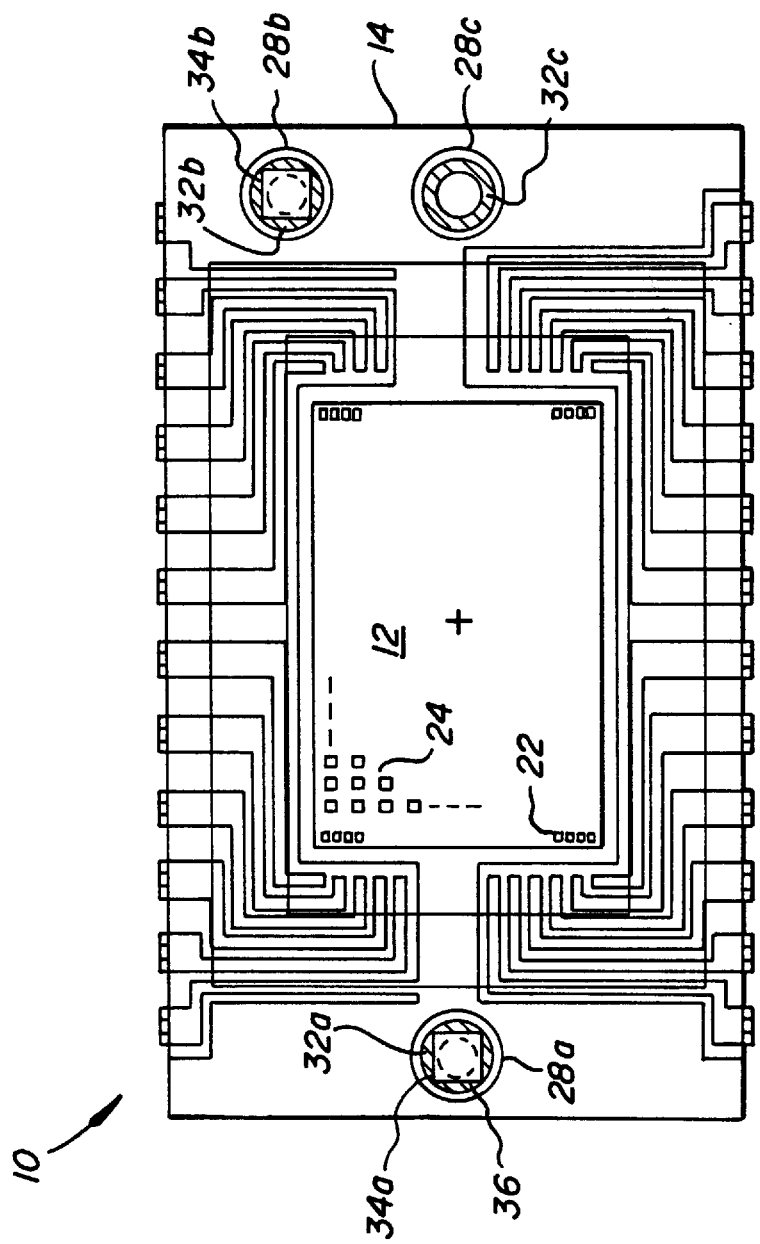
FIG. 1 is a diagram showing an image sensor assembly with reference features arranged according to the invention.
Figure 2:
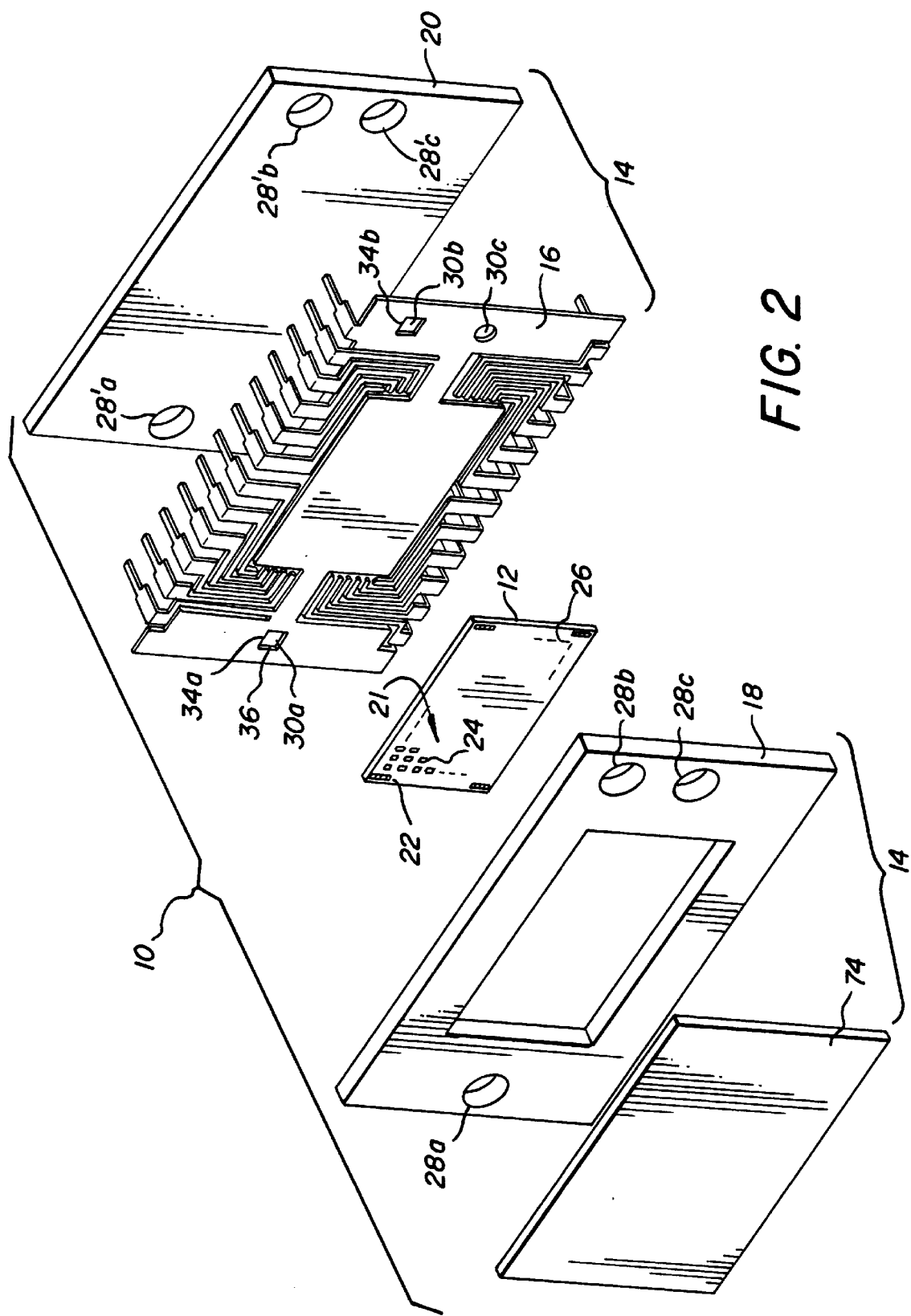
FIG. 2 is an exploded view of the image sensor assembly shown in FIG. 1.

Referring to FIGS. 1 and 2, an image sensor assembly 10 is shown as including an image sensing device 12, such as a conventional charge coupled device, mounted within a carrier package 14. As particularly shown in FIG. 2, the carrier package 14 includes a lead frame 16 interposed between an upper ceramic frame 18 and a lower ceramic frame 20. The image sensing device 12 includes photolithographically generated elements 21 such as bonding pads 22 and image sensing sites 24. In certain cases, one or more photolithographically generated registration marks 26 (shown in broken lines) may also be provided.

The ceramic frames 18 and 20 have three concentric mounting holes 28a, 28b, 28c and 28'a, 28'b, 28'c formed in each ceramic frame. The lead frame 16 includes two square holes 30a and 30b, and a circular hole 30c, which are coaxially interposed between the holes 28a, 28b, 28c and 28'a, 28'b, 28'c on the ceramic frames 18 and 20 when the lead frame 16 is assembled between the frames 18 and 20. Since the holes 30a, 30b, and 30c in the lead frame 16 are smaller than the holes 28a, 28b, 28c and 28'a, 28'b, 28'c, the lead frame 16 forms ledges within the concentric mounting holes that provide a set of target surfaces 32a, 32b, and 32c (as best shown by the shaded areas in FIG. 1). Furthermore, the square holes 30a and 30b provide a first straight edge 34 composed of edge segments 34a and 34b and a second straight edge 36 orthogonal to at least one of the edge segments 34a and 34b (in this case, 34a).

The invention is based upon the referencing technique used in assembling the image sensing device 12 into the carrier package 14 and in emplacing the resulting image sensor assembly 10 in an optical system. In particular, the target surfaces 32a, 32b, and 32c and the edges 34a, 34b and 36 comprise a set of reference features that are used for positioning both the image sensing device 12 on the carrier package 14 and the sensor assembly 10 (sensing device plus carrier package) in an optical system using the device. In one aspect of the invention, the carrier package 14 is exactly constrained with reference to the set of reference features on the carrier package 14, and in another aspect one or more photolithographically generated elements 21 of the image sensing device 12 are optically referenced to the same set of reference features, or at least to a subset of the same set of reference features.

In the assembled carrier package 14, the three target surfaces 32a, 32b, and 32c provide inset reference surfaces to set the plane of the package 14, while the straight edges 34 and 36 provide straight references edges orthogonal to each other in order to determine x and y locations. As is well known, exactly constraining an element involves specifying the minimum number of forces needed to exactly locate the element in a set of spatial coordinates. Six degrees of freedom represent the minimum number of constraints for fully describing the exact location (see "Exact constraint design", by Jon M. Kriegel, *Mechanical Engineering*, May, 1995, pages 88–90). In the case of the carrier package 14, the three target surfaces 32a, 32b, and 32c set the plane, the two straight edge segments 34a and 34b set the x direction, and the second straight edge 36 sets the y direction.

Besides using the straight edge segments 34a and 34b, and the second straight edge 36, in the exact constraint alignment, these straight edges are also used as reference features that are aligned with at least one of the photolithographically generated elements 21 when the image sensing device 12 is positioned in the carrier package 14. This positioning step is ordinarily accomplished with a video system, such as a vision system 38 shown in the flow diagram of FIG. 3.

Figure 3:
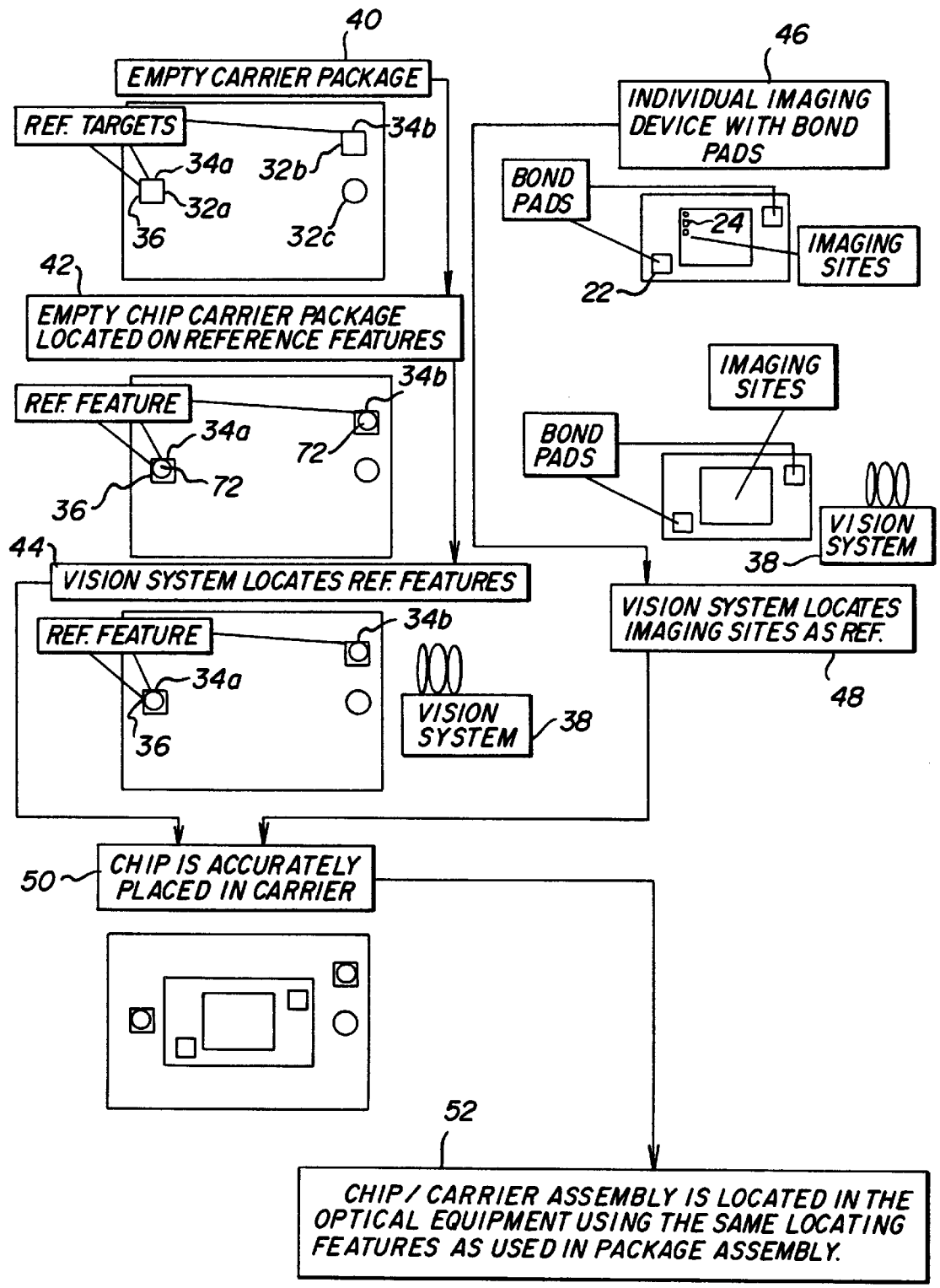
FIG. 3 is a flow diagram showing a method for packaging the image sensor assembly shown in FIG. 1.

The chip/carrier assembly process is diagrammatically shown in FIG. 3 in a series of steps accompanied by representations of the assembly at various stages in the process. The reference target surfaces 32a, 32b, and 32c and edge features 34a, 34b, and 36 are first provided on the empty carrier package 14 (stage 40). Then the empty chip carrier package is located on a set of fixtures 72 against the reference features (stage 42) in order to exactly constrain the package 14 relative to the fixtures 72. At this point, the vision system 38 identifies the location of the reference edge features 34a, 34b, and 36(stage 44). Meanwhile, an image sensing device 12 is provided with bonding pads 22 and image sensing sites 24 (stage 46), and the vision system 38 identifies the location of the imaging sites 24 (stage 48). Then the vision system uses the identified locations of the reference edge features and the imaging sites to accurately place the chip in the carrier (stage 50). Finally, a cover plate 74 (see FIG. 2) is attached to the front surface of the upper ceramic frame 18 and the carrier package 14 is located in the optical system (stage 52) using the same reference edge features as were used in stage 42 in the package assembly process.

Figure 4:
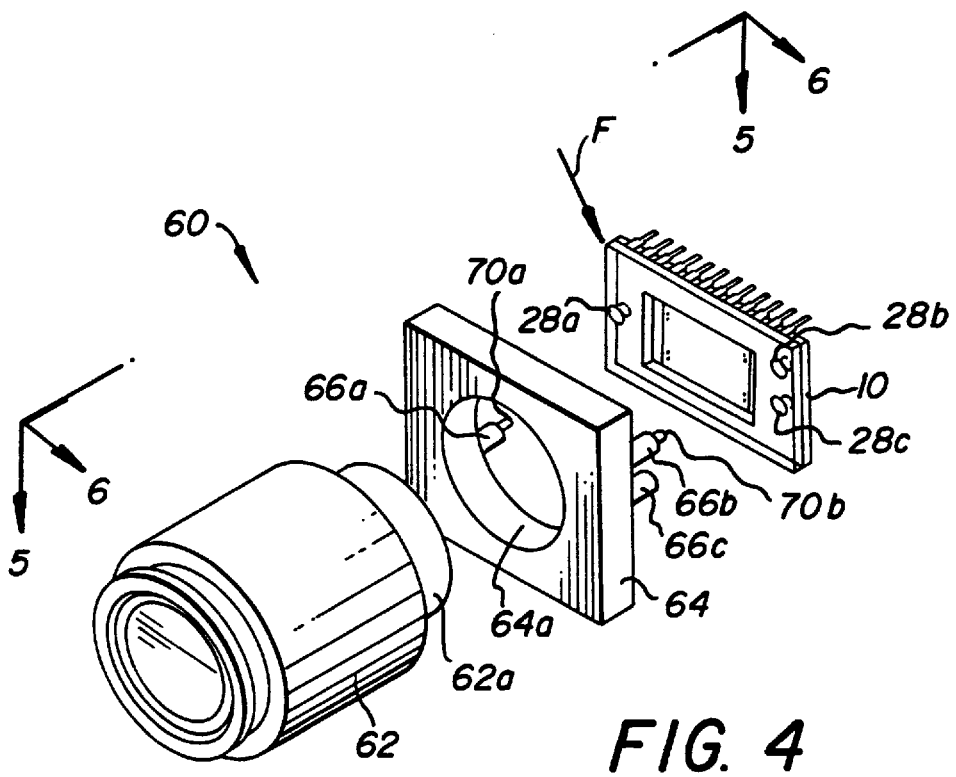
FIG. 4 is a exploded view of an optical system incorporating the image sensor assembly shown in FIG. 1.
Figure 6:
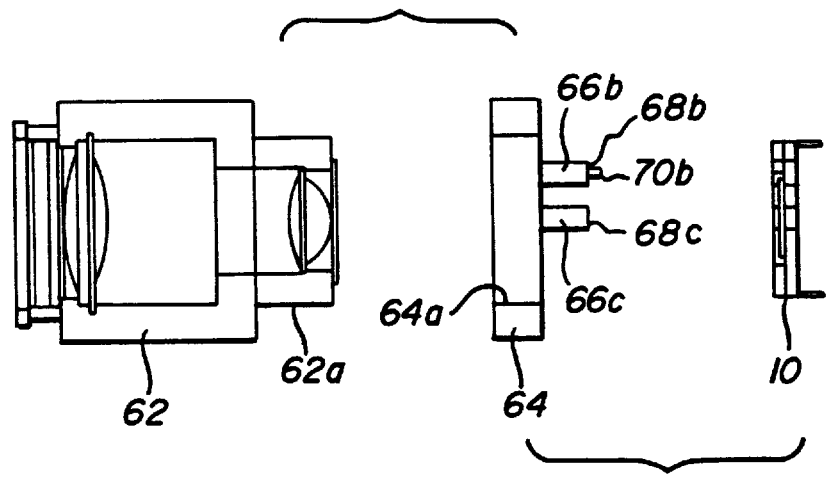
FIG. 6 is a side elevation of the optical system taken along lines 6—6 as shown in FIG. 4.
Figure 5:
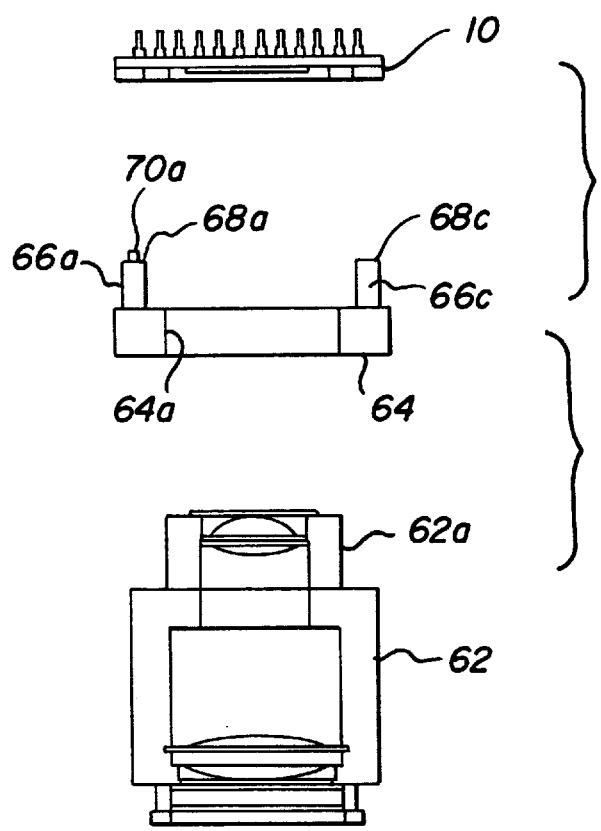
FIG. 5 is a top elevation of the optical system taken along lines 5—5 as shown in FIG. 4.

The image sensor assembly 10 is used in an optical system 60 as shown in FIGS. 4, 5, and 6, comprising a lens 62 and a mounting plate 64 along with the image sensor assembly 10. Inasmuch as FIG. 4 is an exploded view, a recessed barrel 62a of the lens 62 would be fitted into an opening 64a in the mounting plate 64 in the assembled optical system 60. The image sensor assembly 10 would then be exactly constrained upon the mounting plate 64, as explained in the following description. The mounting plate 64 has three reference locators 66a, 66b, and 66c, each further having a flat ledge 68a, 68b, and 68c. The locators 66a and 66b additionally have locating pins 70a and 70b projecting from the ledges 68a and 68b. During assembly, the flat ledges 68a, 68b, and 68c provide the three planar references that mate with the three target surfaces 32a, 32b, and 32c on the carrier package 14 to set the plane of the assembly. In addition, the circumferential surfaces of the locator pins 70a and 70b provide three reference points to contact the two straight edge segments 34a and 34b to set the x direction and the second straight edge 36 to set the y direction of the assembly. (A force F would be applied during the assembly process to the image sensor assembly 10 in the direction shown in FIG. 4 to locate the carrier package 14 against the locator pins 70a and 70b in the square holes 30a and 30b, and the sensor assembly would then be fastened in place against the mounting plate 64.)

The invention has been described with reference to a preferred embodiment. However, it will be appreciated that variations and modifications can be effected by a person of ordinary skill in the art without departing from the scope of the invention.

Parts list 10 image sensor assembly
12 image sensing device
14 carrier package
16 lead frame 18 upper ceramic frame
20 lower ceramic frame
21 photolithographically generated elements
22 bonding pads
24 image sensing sites
26 dedicated registration marks
28a,b,c mounting holes
30a,b,c lead frame holes
32a,b,c target surfaces
34 first straight edge
34a,b edge segments
36 second straight edge
38 vision system
40–50 stages
60 optical assembly
62 lens
64 mounting plate
66a,b,c reference locators
68a,b,c, flat ledge surfaces
70a,b,c posts
72 fixtures

I claim:

1. An image sensor assembly for mounting in an optical system having a plurality of reference locators, wherein said reference locators include a plurality of locator pins extending from respective flat surfaces, said image sensor assembly comprising:

an image sensing device; and a carrier package adapted for exact constraint to a set of three features on the carrier package that are externally accessible to the reference locators to set the plane of the image sensor assembly, said carrier package supporting the image sensing device in a location within the carrier package that is referenced to at least one of the features, and wherein said set of features includes three target surfaces that contact the flat surfaces of the locators to set the plane of the package, and at least two straight edges orthogonal to one another that contact the pins to set the remaining degrees of freedom of the package.

2. An optical system, comprising:

a lens for focusing an image upon an imaging plane;

a plurality of reference locators that are positioned relative to the lens to provide a reference for locating the imaging plane;

an image sensing device;

a carrier package adapted for exact constraint to a set of features on the package that are accessible to the plurality of reference locators, said carrier package supporting the image sensing device in a location that is referenced to the set of features, said set of features including three targets to set the plane of the carrier package against the plurality of reference locators, and at least two straight edges orthogonal to one another that are urged against at least one of the reference locators to set the remaining degrees of freedom; and means for holding the carrier package in place against the plurality of locators in order to exactly constrain the carrier package within the optical system.

3. An optical system as claimed in claim 2 wherein said set of features comprises three holes extending into the carrier package so as to provide adjoining ledges that form the three targets to set the plane of the carrier package against the reference locators, and wherein said at least two straight edges are defined by a set of three points on the circumference of two of the holes.

4. An optical system as claimed in claim 3 wherein two of the holes are squared in order to provide the two straight edges.

5. An optical system as claimed in claim 2 wherein said image sensing device includes photolithographically generated elements, and wherein said elements are optically referenced to the set of features on the carrier package.

6. An image sensor assembly as claimed in claim 5 wherein the photolithographically generated elements are image sensing sites.

7. An image sensor assembly as claimed in claim 5 wherein the photolithographically generated elements are bonding pads.

8. An image sensor assembly as claimed in claim 5 wherein the photolithographically generated elements are dedicated registration marks.

9. An image sensor assembly for mounting in an optical system having a plurality of reference locators, said image sensor assembly comprising:

an image sensing device; and a carrier package adapted for exact constraint to a set of features on the carrier package that are externally accessible to the reference locators, wherein said set of features comprises three openings extending into the carrier package to provide an inset surface that provides three targets to set the plane of the carrier package against the reference locators, and wherein two of the openings are squared in order to provide two straight edges that are urged against at least one of the reference locators to set the remaining degrees of freedom.

10. An image sensor assembly for mounting in an optical system having a plurality of reference locators that include a plurality of locator pins extending from respective flat surfaces, said image sensor assembly comprising:

an image sensing device; and a supporting substrate adapted for exact constraint to a set of features on the substrate that are externally accessible to the reference locators, said substrate supporting the image sensing device in a location on the substrate that is referenced to the set of features, wherein said set of features includes three target surfaces that contact the flat surfaces of the locators to set the plane of the substrate, and at least two straight edges orthogonal to one another that contact the pins to set the remaining degrees of freedom of the substrate.

11. An image sensor assembly as claimed in claim 10 wherein said image sensing device includes photolithographically generated elements, and wherein the photolithographically generated elements are referenced to at least one or more features having the straight edges orthogonal to one another.

* * * * *